United States Patent
Ootera et al.

(10) Patent No.: US 9,396,811 B2
(45) Date of Patent: Jul. 19, 2016

(54) MAGNETIC MEMORY, METHOD OF RECORDING DATA TO AND REPRODUCING DATA FROM MAGNETIC MEMORY, AND METHOD OF OPERATING MAGNETIC MEMORY

(71) Applicant: KABUSHIKI KAISHA TOSHIBA, Minato-ku (JP)

(72) Inventors: Yasuaki Ootera, Yokohama (JP); Takuya Shimada, Yokohama (JP); Shiho Nakamura, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/593,334

(22) Filed: Jan. 9, 2015

(65) Prior Publication Data
US 2015/0262702 A1  Sep. 17, 2015

(30) Foreign Application Priority Data

Mar. 11, 2014  (JP) ................................ 2014-047557

(51) Int. Cl.
| | |
|---|---|
| *G11C 11/16* | (2006.01) |
| *G11C 19/02* | (2006.01) |
| *G11C 19/08* | (2006.01) |
| *G11C 11/02* | (2006.01) |
| *G11C 11/15* | (2006.01) |

(52) U.S. Cl.
CPC ............. *G11C 19/02* (2013.01); *G11C 19/0808* (2013.01); *G11C 19/0841* (2013.01); *G11C 11/161* (2013.01); *G11C 11/1673* (2013.01); *G11C 11/1675* (2013.01)

(58) Field of Classification Search
CPC ........... G11C 19/0808; G11C 11/1675; G11C 11/161; G11C 19/02; G11C 11/1673
USPC ....................................... 365/80, 66, 157, 158
See application file for complete search history.

(56) References Cited

U.S. PATENT DOCUMENTS

| | | | |
|---|---|---|---|
| 6,172,902 B1 | 1/2001 | Wegrowe et al. | |
| 6,834,005 B1 | 12/2004 | Parkin | |
| 7,236,386 B2 | 6/2007 | Parkin | |
| 7,349,242 B2* | 3/2008 | Den ...................... | B82Y 10/00 365/158 |
| 2002/0158342 A1* | 10/2002 | Tuominen .............. | B82Y 10/00 257/784 |

(Continued)

FOREIGN PATENT DOCUMENTS

| | | |
|---|---|---|
| JP | 2005-123298 A | 5/2005 |
| JP | 2005-353819 A | 12/2005 |

(Continued)

*Primary Examiner* — Ly D Pham
(74) *Attorney, Agent, or Firm* — Oblon, McClelland, Maier & Neustadt, L.L.P

(57) ABSTRACT

A magnetic memory according to an embodiment includes: a plurality of groups of magnetic nanowires extending in a direction, each group of magnetic nanowires including at least one magnetic nanowire, each magnetic nanowire having a first terminal and a second terminal; a plurality of recording and reproducing elements corresponding to the groups of magnetic nanowires, each recording and reproducing element writing data to and reading data from magnetic nanowires of a corresponding group of magnetic nanowires, and connecting to the first terminals of the magnetic nanowires of the corresponding group of magnetic nanowires; and an electrode to which the second terminals of the magnetic nanowires of the groups of magnetic nanowires are connected.

11 Claims, 11 Drawing Sheets

(56) References Cited

U.S. PATENT DOCUMENTS

| | | | |
|---|---|---|---|
| 2003/0121764 A1* | 7/2003 | Yang | B82Y 10/00 200/262 |
| 2010/0284209 A1* | 11/2010 | Kim | G11C 8/14 365/80 |
| 2013/0005053 A1 | 1/2013 | Joseph et al. | |
| 2014/0104941 A1* | 4/2014 | Kondo | G11C 11/02 365/171 |
| 2014/0140126 A1 | 5/2014 | Morise et al. | |
| 2014/0241030 A1* | 8/2014 | Fukuzumi | G11C 19/08 365/80 |
| 2014/0301136 A1* | 10/2014 | Inokuchi | G11C 11/61 365/158 |
| 2015/0036422 A1* | 2/2015 | Morise | H01L 27/222 365/158 |

FOREIGN PATENT DOCUMENTS

| | | |
|---|---|---|
| JP | 2007-073103 A | 3/2007 |
| JP | 2007-096119 A | 4/2007 |
| JP | 2010-103390 A | 5/2010 |
| JP | 2011-181642 A | 9/2011 |
| JP | 2014-103260 A | 6/2014 |

* cited by examiner

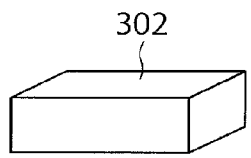 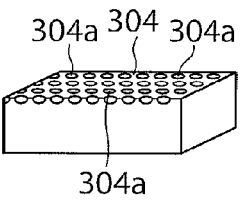 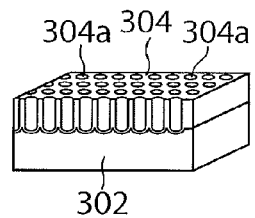 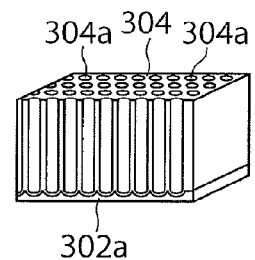
FIG. 5A    FIG. 5B    FIG. 5C    FIG. 5D
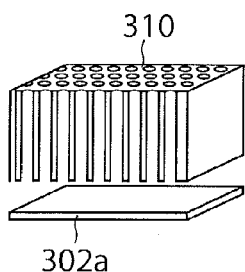 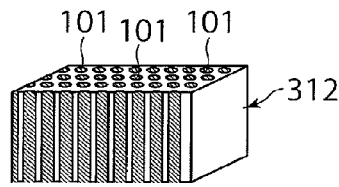
FIG. 5E    FIG. 5F
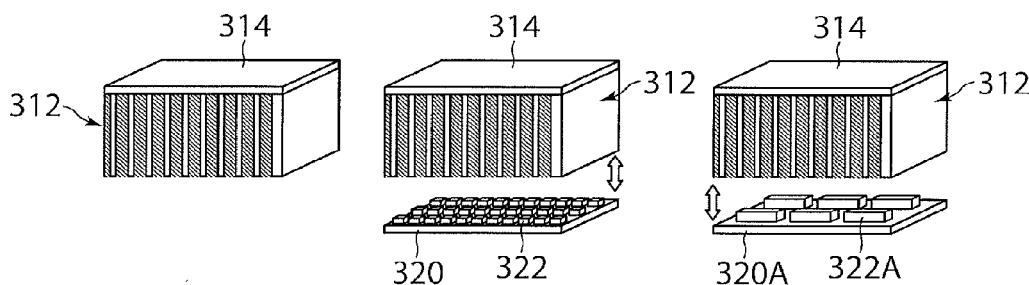
FIG. 5G    FIG. 5H    FIG. 5I

MAGNETIC MEMORY, METHOD OF RECORDING DATA TO AND REPRODUCING DATA FROM MAGNETIC MEMORY, AND METHOD OF OPERATING MAGNETIC MEMORY

CROSS REFERENCE TO RELATED APPLICATIONS

This application is based upon and claims the benefit of priority from prior Japanese Patent Application No. 2014-047557 filed on Mar. 11, 2014 in Japan, the entire contents of which are incorporated herein by reference.

FIELD

Embodiments described herein relate generally to a magnetic memory, a method of recording data to and reproducing data from a magnetic memory, and a method of operating a magnetic memory.

BACKGROUND

Recently, a phenomenon has been reported that magnetic domain walls in a magnetic nanowire are moved by a current flowing through the magnetic nanowire. Attempts have been made to constitute shift registers using this phenomenon. The magnetic nanowires used in the attempts have, at their central portions, recording elements for writing magnetic domain walls in the magnetic nanowires, and reproducing elements for detecting the directions of the magnetization in magnetic domains. Electrodes for causing a current to flow through each magnetic nanowire are provided at both terminals of the magnetic nanowires. The magnetic domain walls are shifted by passing a current through the corresponding magnetic nanowire. The data is recorded as the magnetization direction of the magnetic domain sectioned by the magnetic domain wall, as in the case of other magnetic recording apparatuses such as hard disks. A shift register is proposed in which a magnetic domain containing data is shifted by a current so that the target data can be accessed, and the target data can be read by detecting the magnetization direction of the magnetic domain by a reproducing element disposed at a central portion of the magnetic nanowire.

If a plurality of aforementioned shift registers are integrated to constitute a large-capacity memory, the magnetic nanowires preferably extend in the vertical direction to reduce the area per bit. Also from the viewpoint of disposing electrodes at both ends of the magnetic nanowires and forming corresponding wiring lines on a wafer substrate, the magnetic nanowires preferably extend in a direction perpendicular to the wafer substrate.

The recording element and the reproducing element (hereinafter also referred to as the "recording and reproducing element") disposed at the central portion of the magnetic nanowire are also preferably formed on the wafer substrate since they are formed through a semiconductor lithography process.

In order to obtain a structure in which a recording and reproducing element is formed on a wafer substrate so as to be in contact with a central portion of a magnetic nanowire extending in a direction perpendicular to the wafer substrate, a method is proposed in which the magnetic nanowire is bent to have a U shape so that the bent portion is in contact with the recording and reproducing element on the wafer substrate. In this case, the structure includes electrodes on a plane for causing a current to flow to move magnetic domain walls, and a plurality of recording and reproducing elements on an opposite plane, and magnetic nanowires connecting the electrodes and the recording and reproducing elements, the magnetic nanowires being bent to have a U shape. Both terminals of each U-shaped magnetic nanowire are in contact with the electrodes, the bent portion is in contact with one of the recording and reproducing element, and straight portion is perpendicular to the wafer substrate.

A large-capacity shift register type magnetic memory is thus obtained by three-dimensionally setting magnetic nanowires in a direction perpendicular to a substrate to reduce the area per bit to be recorded, and by shaping the magnetic nanowires to have a U-shape so that the central portion of each magnetic nanowire contacts a recording and reproducing element formed on the wafer substrate.

As described above, the large-capacity shift register type magnetic memory enables each recording and reproducing element on the wafer substrate to be in contact with the central portion of the corresponding magnetic nanowire by three-dimensionally arranging the magnetic nanowire so as to be perpendicular to the wafer substrate to reduce the area per bit to be recorded, and by shaping the magnetic nanowire to have a U shape.

The diameter and the pitch of the magnetic nanowire to obtain a large-scale memory with a capacity of a few T bits or more per one chip (100 mm$^2$), for example, are on the order of a few ten nm, and the length is on the order of µm. A method proposed to form such a magnetic nanowire arrangement includes forming perpendicular holes by, for example, deep dry etching by means of a Bosch process, and filling the holes with a magnetic material. However, it is difficult to form fine holes with the aspect ratio of a few hundred or more with the Bosch process. Furthermore, it is difficult to process U-shaped holes.

Anodizing is another method proposed to form a magnetic nanowire arrangement with a high aspect ratio. In this method, a voltage is applied to an anode formed of an aluminum substrate in an electrolytic solution so that the dissolution of aluminum and the growth of a resultant element are advanced by oxidation to form holes in aluminum oxide. Holes with the pitch of a few ten nm and the depth of a few hundred µm can be formed by controlling the voltage and the solution. Magnetic nanowires meeting the target recording density can be obtained by filling the holes with a magnetic material. However, this method cannot form a U-shaped structure easily. Furthermore, since the anodizing advances somewhat irregularly, it is difficult to ensure a complete control of magnetic nanowire arrangement and a linear formation of magnetic nanowires with this method.

A method of producing a large-scale shift register type magnetic memory is being studied, in which a wafer substrate on which an electrode for a current to drive magnetic domain walls is formed, a wafer substrate on which recording and reproducing elements are formed, and a substrate on which perpendicular magnetic nanowires are formed by the aforementioned method are separately prepared, and the three substrates are bonded together with the alignment among them being precisely made. The substrate on which the electrode for moving magnetic domain walls is formed and the substrate on which the recording and reproducing elements are formed are bonded from opposite sides to the substrate in which the magnetic nanowires are formed. In bonding the substrates, the substrates should be positioned correctly and accurately. However, since the pitch of the magnetic nanowires is a few ten nm, it is difficult to bond the substrate correctly and accurately with the present techniques. In some cases, the correct positioning among the patterns on all of the three substrates is impossible. For example, anodizing may not always form holes regularly and linearly in the substrate in which magnetic nanowires are to be formed. Therefore, regardless of the positioning accuracy, the electrode for moving the magnetic domain walls and the recording and reproducing elements may not be connected with the magnetic nanowires so that each magnetic nanowire corresponds to one of the recording and reproducing elements only by the positioning of the three substrates.

There is another problem in that the magnetic domain walls may stop moving at the bent portion of the U-shaped magnetic nanowire. If this occurs, the shift operation may not be performed even if a current flows.

BRIEF DESCRIPTION OF THE DRAWINGS

FIGS. 5A to 5I are diagrams showing a method of manufacturing a magnetic memory according to a third embodiment.

DETAILED DESCRIPTION

A magnetic memory according to an embodiment includes: a plurality of groups of magnetic nanowires extending in a direction, each group of magnetic nanowires including at least one magnetic nanowire, each magnetic nanowire having a first terminal and a second terminal; a plurality of recording and reproducing elements corresponding to the groups of magnetic nanowires, each recording and reproducing element writing data to and reading data from magnetic nanowires of a corresponding group of magnetic nanowires, and connecting to the first terminals of the magnetic nanowires of the corresponding group of magnetic nanowires; and an electrode to which the second terminals of the magnetic nanowires of the groups of magnetic nanowires are connected.

Embodiments will now be explained with reference to the accompanying drawings.

(First Embodiment)

Figure 1:
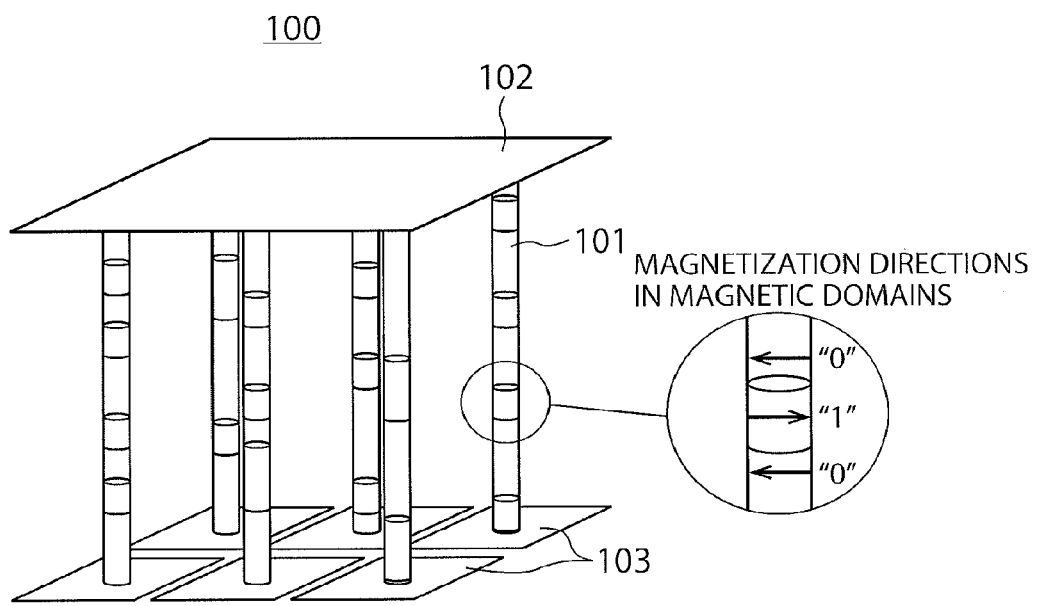
FIG. 1 is a perspective view showing a magnetic memory according to a first embodiment.

FIG. 1 shows a magnetic memory according to a first embodiment. The magnetic memory 100 of the first embodiment includes a plurality of magnetic nanowires 101 that are perpendicular to a surface of a substrate (not shown), on which the magnetic memory 100 is formed, a non-magnetic electrode 102, to which one terminal of each magnetic nanowire 101 is connected, and recording and reproducing elements 103 arranged in a matrix form, each corresponding to one of the magnetic nanowires 101 and connected to the other end of the corresponding magnetic nanowire 101. Hereinafter, the magnetic nanowires will also be called "columns of magnetic nanowires." The non-magnetic electrode 102 is formed of such materials as gold, silver, copper, or aluminum. A wiring line is also present to select one of the recording and reproducing elements 103 arranged in a matrix form based on address data, the wiring line being not shown in FIG. 1. A wiring line (not shown) for sending a signal for writing data to the selected recording and reproducing element 103, and a wiring line (not shown) through which a read signal flows, are also present.

In the magnetic memory 100 according to the first embodiment, data is recorded based on the magnetization direction in a magnetic domain of the magnetic nanowire 101. Data is recorded by controlling the magnetization direction of a magnetic domain on the magnetic nanowire 101 by the recording and reproducing element, and read by reading the magnetization direction of the magnetic domain on the magnetic nanowire 101 by the recording and reproducing element. Each magnetic nanowire 101 has a few hundred magnetic domains, and stores data of a few hundred bits. The magnetic domain walls are moved by causing a current to flow through the magnetic nanowire 101. In accordance of the movement of the magnetic domain walls, magnetic domains sandwiched by the magnetic domain walls are also shifted. The target data (magnetic domain) can be accessed by shifting the target magnetic domain to a position corresponding to the reproduction unit.

The recording and reproducing element 103 of the magnetic memory according to the first embodiment is at one terminal of each magnetic nanowire 101. Therefore, if the magnetic domain are shifted to the non-magnetic electrode 102 side, no data is lost, but if they are shifted in the opposite direction, data may be lost since no magnetic nanowire 101 is present after the recording and reproducing element 103. Accordingly, basically two magnetic nanowires 101 forms a pair with data being exchanged therebetween, and act as a single magnetic nanowire (a unit of shift register). The structure of the magnetic memory is not limited to the above, but data of the last recorded bit may always be read. For example, data of 500 bits can be sequentially recorded by shifting the magnetic domains, and can be read from the last $500^{th}$ bit toward the first bit by reversing the shifting direction. In this case, the read data is lost from the magnetic nanowire by the nest shift operation.

(Operation)

The operation of the shift register type magnetic memory 100 will be described with reference to FIGS. 2A to 2D. One terminal (upper end) of each of the magnetic nanowires 101a, 101b of the magnetic memory 100 shown in each of FIGS. 2A to 2D is connected to the non-magnetic electrode 102. The side portion of the other terminal (lower end) of the magnetic nanowire 101a is connected to the recording and reproducing element 103a via a non-magnetic layer 105, and the side portion of the other terminal of the magnetic nanowire 101b is connected to the recording and reproducing element 103b via the non-magnetic layer 105. Except for the lower ends, the side portions of the magnetic nanowires 101a, 101b are surrounded by an insulating material 107. The non-magnetic layer 105 is present between the insulating material 107 and the recording and reproducing element 103a, and between the insulating material 107 and the recording and reproducing element 103b.

The bottoms of the other terminals of the magnetic nanowires 101a, 101b of the magnetic memory 100 shown in each of FIGS. 2A to 2D are also covered by the non-magnetic layer 105.

The recording and reproducing element 103a includes an electrode $103a_1$, an antiferromagnetic layer $103a_2$, a magnetization fixed layer $103a_3$, a ferromagnetic layer $103a_4$, a ferromagnetic layer $103a_5$, a magnetization fixed layer $103a_6$, an antiferromagnetic layer $103a_7$, and an electrode $103a_8$. These layers and electrodes are stacked in the direction parallel to the surface of the substrate on which the magnetic memory 100 is formed. The other terminal of the magnetic nanowire 101a is covered by the non-magnetic layer 105, and located between the ferromagnetic layer $103a_4$ and the ferromagnetic layer $103a_5$. The magnetization direction of the magnetization fixed layer $103a_3$ is fixed by the antiferromagnetic layer $103a_2$, and the magnetization direction of the magnetization fixed layer $103a_6$ is fixed by the antiferromagnetic layer $103a_7$. The magnetization direction of the magnetization fixed layer $103a_3$ and the magnetization direction of the magnetization fixed layer $103a_6$ are antiparallel (opposite) to each other.

The recording and reproducing element 103b includes an electrode $103b_1$, an antiferromagnetic layer $103b_2$, a magnetization fixed layer $103b_3$, a ferromagnetic layer $103b_4$, a ferromagnetic layer $103b_5$, a magnetization fixed layer $103b_6$, an antiferromagnetic layer $103b_7$, and an electrode $103b_8$. These layers and electrodes are stacked in the direction parallel to the surface of the substrate on which the magnetic memory 100 is formed. The other terminal of the magnetic nanowire 101b is covered by the non-magnetic layer 105, and disposed between the ferromagnetic layer $103b_4$ and the ferromagnetic layer $103b_5$. The magnetization of the magnetization fixed layer $103b_3$ is fixed by the antiferromagnetic layer $103b_2$, and the magnetization of the magnetization fixed layer $103b_6$ is fixed by the antiferromagnetic layer $103b_7$. The magnetization direction of the magnetization fixed layer $103b_3$ and the magnetization direction of the magnetization fixed layer $103b_6$ are antiparallel (opposite) to each other.

One of the basic operations of the magnetic memory 100 will be described below to shift magnetic domains by one bit so as to access target data stored at a certain location of the magnetic nanowires 101a, 101b, which serve as a unit of shift register. Specifically, the magnetic domains on the magnetic nanowire 101a are shifted by one bit, the data (the magnetization direction of the magnetic domain) recorded at the end portion of the magnetic nanowire 101b is read therefrom and written to the end portion of the magnetic nanowire 101a. Thereafter, the magnetic domains on the magnetic nanowire 101b are shifted by one bit. The one-bit shifting operation from the magnetic nanowire 101b to the magnetic nanowire 101a can be performed without losing the data in this manner.

Figure 2A:
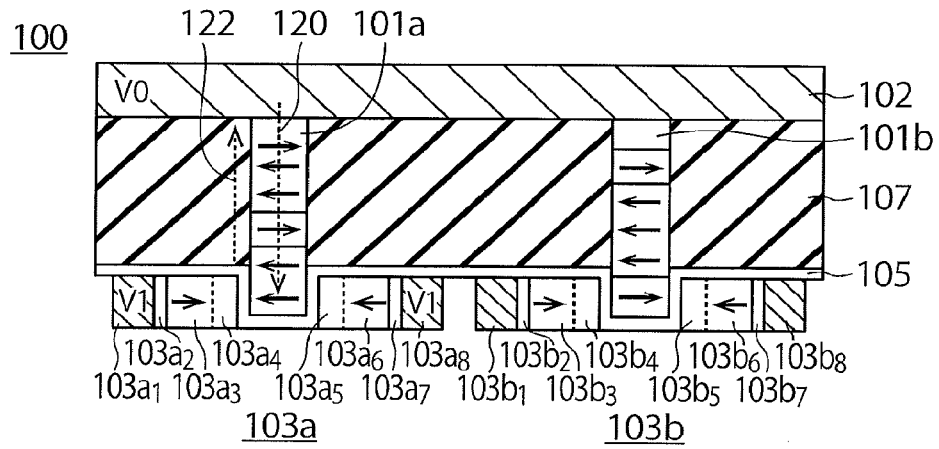
FIGS. 2A to 2D are explanatory diagrams illustrating operations of the magnetic memory according to the first embodiment.
Figure 2B:
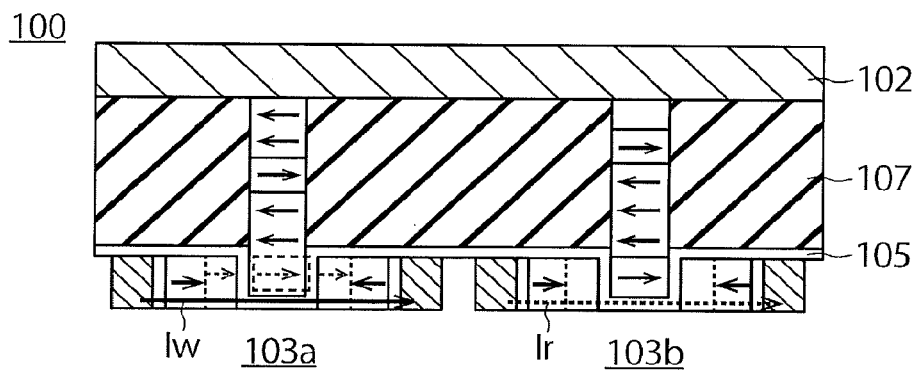

The above operation will be described in more detail. First, a potential V0 is applied to the non-magnetic electrode 102, and a potential V1 is applied to the electrode $103a_1$ and the electrode $103a_8$ of the recording and reproducing element 103a as shown in FIG. 2A. If V0>V1, a current flows on the magnetic nanowire 101a from the non-magnetic electrode 102 to the recording and reproducing element 103a as indicated by an arrow 120. The spin of electrons in the current acts on the magnetic domain walls, and the magnetic domain walls move toward the non-magnetic electrode 102, in a direction along which the electrons flow, i.e., the direction opposite to the direction of the current as indicated by an arrow 122. The shifting by one bit can be performed by appropriately setting the current amount and the time. As a result, a recording region corresponding to one bit is generated at the end of the magnetic nanowire 101a on the recording and reproducing element 103a side (FIG. 2B).

Next, the magnetic domains on the magnetic nanowire 101b are shifted by one bit to the recording and reproducing element 103b side. This, however, may lose the data at the end portion on the recording and reproducing element 103b side of the magnetic nanowire 101b. Accordingly, the data recorded in this portion is moved to the recording region of the magnetic nanowire 101a, which was generated in the previous step, at the end portion of the recording and reproducing element 103a. The movement is performed in the following manner. First, a voltage is applied between the electrode $103b_1$ and the electrode $103b_8$ on the recording and reproducing element 103b side to cause a read current Ir to flow. The end portion of magnetic nanowire 103b containing a bit to be moved is present on the path of the read current Ir between the ferromagnetic layer $103b_4$ and the ferromagnetic layer $103b_5$. Therefore, the resistance between the electrode $103b_1$ and the electrode $103b_8$ changes in accordance with whether the magnetization direction of the magnetic domain containing the bit to be moved is the same as or opposite to the magnetization direction of the ferromagnetic layer $103b_4$ and the ferromagnetic layer $103b_5$. Specifically, if the magnetization direction is the same, the resistance becomes lower, and if it is opposite, the resistance becomes higher. Therefore, if the magnetization directions of the ferromagnetic layer $103b_4$ and the ferromagnetic layer $103b_5$ are caused to be in a known or predetermined direction, the magnetization direction (whether the data is "0" or "1") of the magnetic domain at the end portion of the magnetic nanowire 101b containing the bit to be moved can be obtained from the magnitude of the resistance (magnitude of the read current Ir) between the electrode $103b_1$ and the electrode $103b_8$.

Next, the data read from the magnetic nanowire 101b is recorded in the magnetic nanowire 101a. The recording is performed by causing a write current Iw to flow between the electrode $103a_1$ and the electrode $103a_8$ of the recording and reproducing element 103a on the magnetic nanowire 101a side. If the write current Iw is higher than the read current Ir, the magnetization direction of the ferromagnetic layers $103a_4$, $103a_5$ can be controlled in accordance with the direction of the write current Iw by the magnetization fixed layers $103a_3$, $103a_6$. The magnetization direction of the magnetic domain at the tip portion (lower end portion) of the magnetic nanowire 101a at this time follows the magnetization direction of the ferromagnetic layers $103a_4$, $103a_5$. Thus, the magnetization direction of the magnetic domain at the tip portion (lower end portion) of the magnetic nanowire 101a can be controlled to record data "0" or "1" by the direction of the write current Iw caused to flow between the electrode $103a_1$ and the electrode $103a_8$ of the recording and reproducing element 103a (FIG. 2B). The direction of the write current Iw is determined by the data read from the magnetic nanowire 101b. As described above, data of one bit can be moved from the magnetic nanowire 103b to the magnetic nanowire 101a.

Figure 2C:
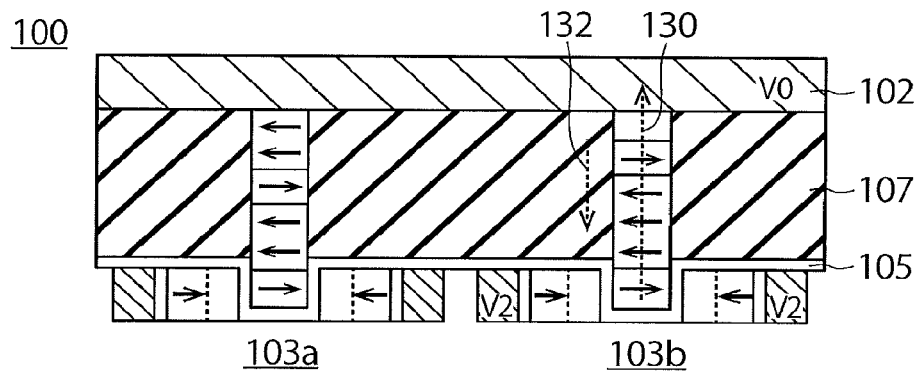
Figure 2D:
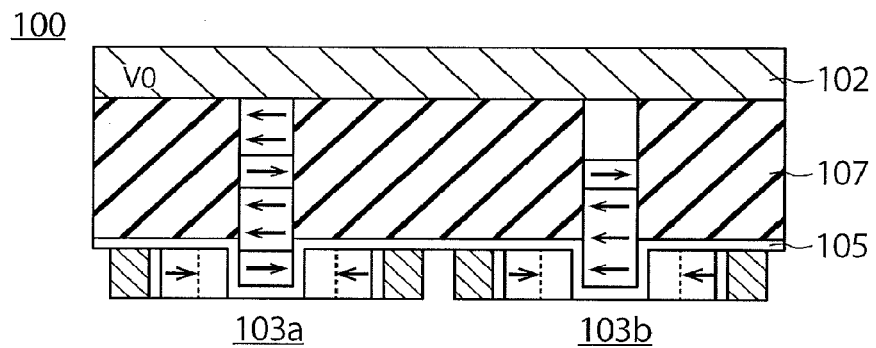

Finally, the magnetic domains on the magnetic nanowire 101b are shifted by one bit. Specifically, a potential V0 is applied to the non-magnetic electrode 102, and a potential V2 (V0<V2) is applied to the electrode $103b_1$ and the electrode $103b_8$ of the recording and reproducing element 103b on the magnetic nanowire 101b side, as shown in FIG. 2C. As result, a current flows in the direction shown by an arrow 130 on the magnetic nanowire 101b to move the magnetic domain walls of the magnetic nanowire 103b due to the influence of the spin of electrons. Accordingly, the magnetic domains are shifted along the direction indicated by an arrow 132, which is opposite to the direction indicated by the arrow 130 in which the current flows, to the recording and reproducing element 103b side (FIG. 2D). The magnetic domains can be shifted by one bit by controlling the current amount and the time in this manner.

The magnetic domains can be shifted by one bit from the magnetic nanowire 101b to the magnetic nanowire 101a without losing any data by the aforementioned method. A shift operation for shifting the magnetic domains containing a plurality of bits can be performed by repeating the above operation. Furthermore, the direction of the shift operation can be reversed if the magnetic nanowire 101a is read as the magnetic nanowire 101b, and the magnetic nanowire 101b is read as the magnetic nanowire 101a, and the above operation is performed. Using this technique, data at a predetermined position on a magnetic nanowire can be moved to a position corresponding to the recording and reproducing element by a shift operation, and can be read and reproduced by the read current Ir. Similarly, target data can be written to a predetermined position by the write current 1w.

The terminals of the magnetic nanowires are connected to the common non-magnetic electrode without distinguishing each nanowire from the others in the magnetic memory according to the first embodiment. Accordingly, the required level of accuracy in positioning can be eased in the manufacturing process. Furthermore, the other terminal of each magnetic nanowire can be connected to the corresponding recording and reproducing element so that the magnetic nanowire is not u-shaped but linearly shaped. As a result, the magnetic nanowire does not have any curved portion, which would block the shift operation of the magnetic domain walls. This makes the manufacture of the magnetic nanowires easier.

The recording and reproducing elements 103a, 103b of the first embodiment, each including ferromagnetic layers that are in contact with a terminal of a magnetic nanowire via a non-magnetic layer, a pair of magnetization fixed layers in contact with the ferromagnetic layers, antiferromagnetic layers, and a pair of electrodes, have an advantage of enabling an magnetic domain to be made in the magnetic nanowires 101a, 101b extending in a direction perpendicular to the recording and reproducing element as in the case of the magnetic memory 100 according to the first embodiment. Furthermore, the recording and reproducing elements are capable of performing so-called "perpendicular magnetic recording" to make the magnetization in a direction perpendicular to the longitudinal direction of the magnetic nanowires 101a, 101b. This can improve the recording density of the magnetic nanowires 101a, 101b. In addition, the electrodes of the recording and reproducing elements 103a, 103b, together with the common non-magnetic electrode 102, may serve as electrodes for causing a current to shift the magnetic domains on the magnetic nanowire.

(Second Embodiment)

Figure 3:
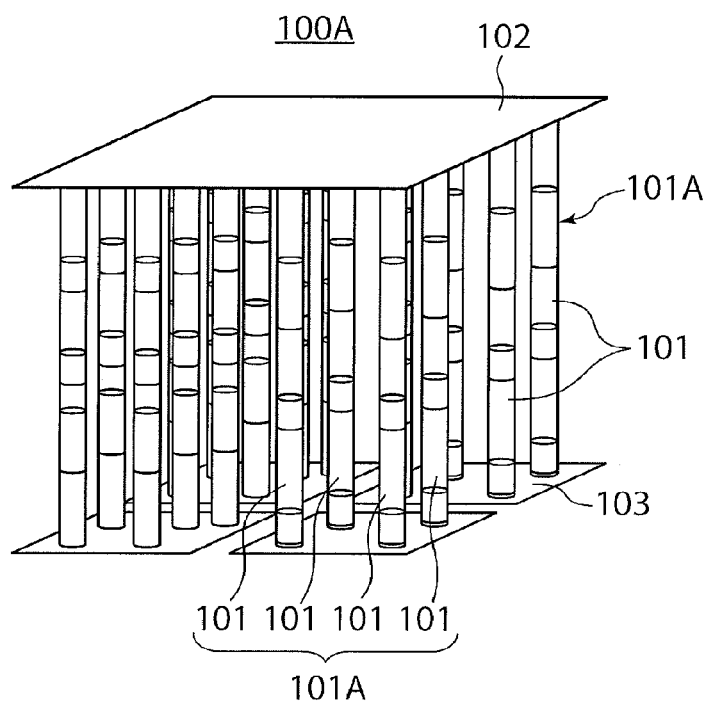
FIG. 3 is a perspective view showing a magnetic memory according to a second embodiment.

A magnetic memory according to a second embodiment will be described with reference to FIG. 3. The magnetic memory 100A according to the second embodiment has a structure in which a plurality of magnetic nanowires 101 are connected to each recording and reproducing element 103 in the magnetic memory 100 of the first embodiment shown in FIG. 1. Thus, a group of magnetic nanowires 101A including a plurality of magnetic nanowires 101 is connected to each recording and reproducing element 103.

As in the case of the first embodiment, the magnetic memory 100A according to the second embodiment records data in accordance with the magnetization directions of the magnetic domains on each magnetic nanowire 101. The data is recorded to each magnetic domain of the magnetic nanowire by controlling the magnetization direction of the magnetic domain by means of the recording and reproducing element, and reproduced by reading the magnetization direction of the magnetic domain by means of the recording and reproducing element. Each magnetic nanowire 101 has a few hundred magnetic domains and stores data of a few hundred bits. A current flowing through the magnetic nanowire 101 moves the magnetic domain walls, and thus shifts the magnetic domains sandwiched between the magnetic domain walls. Target data (magnetic domain) can be accessed by shifting the target magnetic domain to a position corresponding to the recording and reproducing element 103.

In the second embodiment, a group of magnetic nanowires including a plurality of magnetic nanowires 101 is connected to each recording and reproducing element 103. Therefore, the recording operation, the reproducing operation, and the shift operation can be performed on all the magnetic nanowires of the group of magnetic nanowires connected to the recording and reproducing element 103 simultaneously by a single operation. The resistance of the magnetic nanowires to defects such as disconnection of lines, and errors in reproducing the records and performing shift operation can be improved in this manner.

(Operation)

Figure 4A:
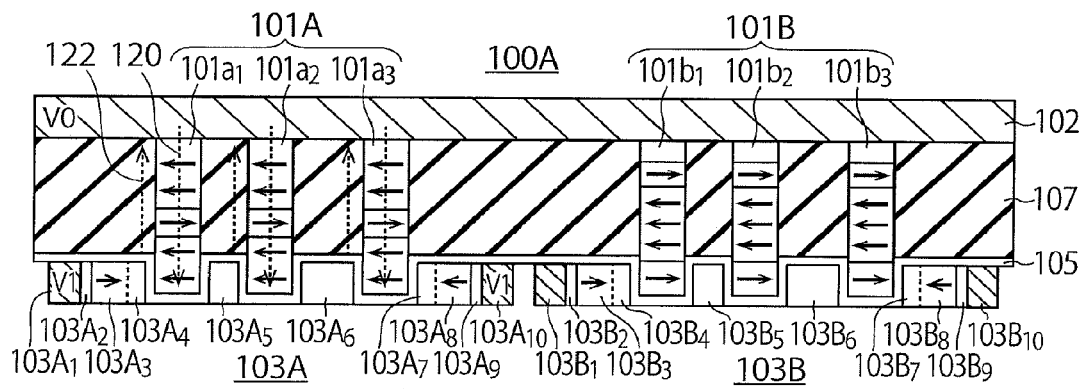
FIGS. 4A to 4D are explanatory diagrams illustrating operations of the magnetic memory according to the second embodiment.
Figure 4B:
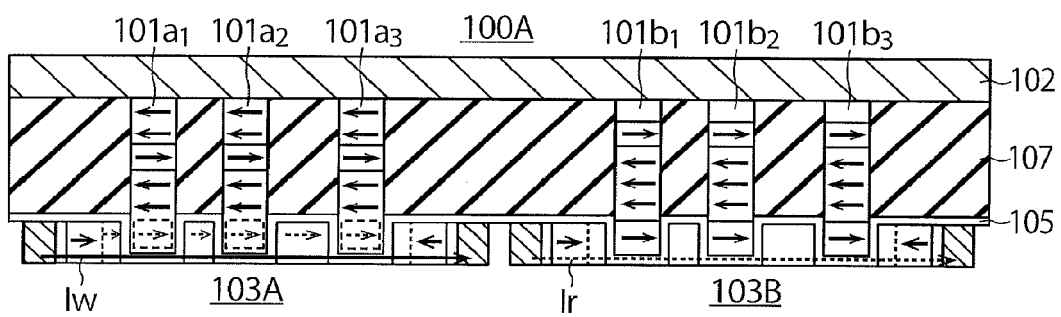

The operation of the shift register type magnetic memory 100A will be described with reference to FIGS. 4A to 4D. In FIGS. 4A and 4B, a group of magnetic nanowires 101A includes magnetic nanowires $101a_1$-$101a_3$, each having one terminal (upper end) connected to a non-magnetic electrode 102, and the other terminal (lower end), the side portion of which is connected to a recording and reproducing element 103A via a non-magnetic layer 105. The magnetic nanowire $101a_2$ is disposed between the magnetic nanowire $101a_1$ and the magnetic nanowire $101a_3$. A group of magnetic nanowires 101B includes magnetic nanowires $101b_1$-$101b_3$, each having one terminal (upper end) connected to the non-magnetic electrode 102, and the other terminal, the side portion of which is connected to a recording and reproducing element 103B via the non-magnetic layer 105. The magnetic nanowire $101b_2$ is disposed between the magnetic nanowire $101b_1$ and the magnetic nanowire $101b_3$. The side portions of the magnetic nanowires $101a_1$-$101a_3$ and the magnetic nanowires $101b_1$-$101b_3$, except for those of the other terminals, are covered by an insulating material 107. The non-magnetic layer 105 is disposed between the insulating material 107 and the recording and reproducing element 103A, and between the insulating material 107 and the recording and reproducing element 103B.

In the magnetic memory 100A shown in FIGS. 4A to 4D, the bottoms of the other terminals of the magnetic nanowires $101a_1$-$101a_3$ and $101b_1$-$101b_3$ are also covered by the non-magnetic layer 105.

The recording and reproducing element 103A includes an electrode $103A_1$, an antiferromagnetic layer $103A_2$, a magnetization fixed layer $103A_3$, a ferromagnetic layer $103A_4$, a ferromagnetic layer $103A_5$, a ferromagnetic layer $103A_6$, a ferromagnetic layer $103A_7$, a magnetization fixed layer $103A_8$, an antiferromagnetic layer $103A_9$, and an electrode $103A_{10}$. These layers and electrodes are stacked along a direction parallel to the surface of a substrate, on which the magnetic memory 100A is formed. The other terminal of the magnetic nanowire $101a_1$ is disposed between the ferromagnetic layer $103A_4$ and the ferromagnetic layer $103A_5$, and the non-magnetic layer 105 is disposed between the magnetic nanowire $101a_1$ and the ferromagnetic layer $103A_4$, and between the magnetic nanowire $101a_1$ and the ferromagnetic layer $103A_5$. The other end of the magnetic nanowire $101a_2$ is disposed between the ferromagnetic layer $103A_5$ and the ferromagnetic layer $103A_6$, and the non-magnetic layer 105 is disposed between the magnetic nanowire $101a_2$ and the ferromagnetic layer $103A_5$, and between the magnetic nanowire $101a_2$ and the ferromagnetic layer $103A_6$. The other end of the magnetic nanowire $101a_3$ is disposed between the ferromagnetic layer $103A_6$ and the ferromagnetic layer $103A_7$, and the non-magnetic layer 105 is disposed between the magnetic nanowire $101a_3$ and the ferromagnetic layer $103A_6$, and between the magnetic nanowire $101a_3$ and the ferromagnetic layer $103A_7$. The magnetization direction of the magnetization fixed layer $103A_3$ is fixed by the antiferromagnetic layer $103A_2$, and the magnetization direction of the magnetization fixed layer $103A_8$ is fixed by the antiferromagnetic layer $103A_9$. The magnetization direction of the magnetization fixed layer $103A_3$ and the magnetization direction of the magnetization fixed layer $103A_8$ are antiparallel to each other.

The recording and reproducing element 103B includes an electrode $103B_1$, an antiferromagnetic layer $103B_2$, a magnetization fixed layer $103B_3$, a ferromagnetic layer $103B_4$, a ferromagnetic layer $103B_5$, a ferromagnetic layer $103B_6$, a ferromagnetic layer $103B_7$, a magnetization fixed layer $103B_8$, an antiferromagnetic layer $103B_9$, and an electrode $103B_{10}$. These layers and electrodes are stacked along a direction parallel to the surface of the substrate on which the magnetic memory 100A is formed. The other terminal of the magnetic nanowire $101b_1$ is disposed between the ferromagnetic layer $103b_4$ and the ferromagnetic layer $103b_5$, and the non-magnetic layer 105 is disposed between the magnetic nanowire $101b_1$ and the ferromagnetic layer $103b_4$, and between the magnetic nanowire $101b_1$ and the ferromagnetic layer $103b_5$. The other terminal of the magnetic nanowire $101b_2$ disposed between the ferromagnetic layer $103B_5$ and the ferromagnetic layer $103B_6$, and the non-magnetic layer 105 is disposed between the magnetic nanowire $101b_2$ and the ferromagnetic layer $103B_5$, and between the magnetic nanowire $101b_2$ and the ferromagnetic layer $103B_6$. The other terminal of the magnetic nanowire $101b_3$ is disposed between the ferromagnetic layer $103B_6$ and the ferromagnetic layer $103B_7$, and the non-magnetic layer 105 is disposed between the magnetic nanowire $101b_3$ and the ferromagnetic layer $103B_6$, and between the magnetic nanowire $101b_3$ and the ferromagnetic layer $103B_7$. The magnetization direction of the magnetization fixed layer $103B_3$ is fixed by the antiferromagnetic layer $103B_2$, and the magnetization direction of the magnetization fixed layer $103B_8$ is fixed by the antiferromagnetic layer $103B_9$. The magnetization direction of the magnetization fixed layer $103B_3$ and the magnetization direction of the magnetization fixed layer $103B_8$ are antiparallel (opposite) to each other.

One of the basic operations of the magnetic memory 100A to shift magnetic domains by one bit so as to access target data stored at a certain location of two groups of magnetic nanowires 101A, 101B, which serve as a unit of shift register, will be described below. Specifically, the magnetic domains on the group of magnetic nanowires 101A are shifted by one bit, data (the magnetization direction of the magnetic domain) recorded at the end portion (lower end) of the group of magnetic nanowires 101B is read from and written to the end portion (lower end) of the group of magnetic nanowires 101A. Thereafter, the magnetic domains on the group of magnetic nanowires 101B are shifted by one bit. The one-bit shifting operation can be performed in this manner from the group of magnetic nanowires 101B to the group of magnetic nanowires 101A without losing the data. It is assumed that the magnetic nanowires in the same group of magnetic nanowires have the same data.

The above operation will be described in more detail. First, a potential V0 is applied to the non-magnetic electrode 102, and a potential V1 is applied to the electrode $103A_1$ and the electrode $103A_{10}$ of the recording and reproducing element 103A, as shown in FIG. 4A. As a result, the voltages V0 and V1 are applied to both the terminals of each of the magnetic nanowires $101a_1$-$101a_3$ of the group of magnetic nanowires 101A. If V0>V1, a current flows on the group of magnetic nanowires 101A from the non-magnetic electrode 102 to the recording and reproducing element 103A as indicated by arrows 120. The spin of the electrons in the current acts on the magnetic domain walls, and the magnetic domain walls of the group of magnetic nanowires 101A move toward the non-magnetic electrode 102 in a direction along which electrons flow, i.e., the direction opposite to the direction of the current, as indicated by arrows 122. The shifting of all the magnetic domains of the group of magnetic nanowires 101A by one bit can be performed by appropriately setting the current amount and the time. As a result, a recording region corresponding to 1 bit is generated at the end of each of the magnetic nanowires $101a_1$-$101a_3$ of the group of magnetic nanowires 101A on the recording and reproducing element 103A side.

Next, the magnetic domains on the group of magnetic nanowires 101B are shifted by one bit to the recording and reproducing element 103B side. This may lose the data at the end portions on the recording and reproducing element 103B side of the magnetic nanowire $101b_1$-$101b_3$ of the group of magnetic nanowires 101B. Accordingly, the data to be lost is moved to the end portions of the magnetic nanowires $101a_1$-$101a_3$ of the group of magnetic nanowires 101A on the recording and reproducing element 103A side. The movement is performed in the following manner. First, a voltage is applied between the electrode $103B_1$ and the electrode $103B_{10}$ of the recording and reproducing element 103B to cause a read current Ir to flow, as shown in FIG. 4B. On the path of the read current Ir, the ferromagnetic layers $103B_4$, $103B_5$, $103B_5$, $103B_7$ and the tip portions of the magnetic nanowires $101b_1$-$101b_3$, with the bits to be moved, of the group of magnetic nanowires 101B are present. Since the same data is stored in the magnetic nanowires $101b_1$-$101b_3$ of the group of magnetic nanowires 103B, the magnetization direction is the same in all the magnetic domains at the tip portions of the group of magnetic nanowires 101B. The resistance between the electrode $103B_1$ and the electrode $103B_{10}$ considerably changes in accordance with whether the magnetization direction of the magnetic domain at each tip portion corresponding to the bit to be moved is the same as or opposite to the magnetization direction of the ferromagnetic layers $103B_4$, $103B_5$, $103B_6$, $103B_7$. Specifically, if the magnetization direction is the same, the resistance becomes smaller, and if it is opposite, the resistance becomes greater. Therefore, if the magnetization directions of the ferromagnetic layers $103B_4$, $103B_5$, $103B_6$, $103B_7$ are in a known or predetermined direction, the magnetization direction of the magnetic domains at the tip portions of the group of magnetic nanowires 101B can be obtained from the magnitude of the resistance or the magnitude of the current Ir between the electrode $103B_1$ and the electrode $103B_{10}$.

Next, the data read from the group of magnetic nanowires 101B is recorded to the group of magnetic nanowires 101A. The recording is performed by causing a write current Iw to flow between the electrode $103A_1$ and the electrode $103A_{10}$ of the recording and reproducing element 103A on the group of magnetic nanowires 101A side, as shown in FIG. 4B. If the write current Iw is higher than the read current Ir, the magnetization direction of the ferromagnetic layers $103A_4$, $103A_5$, $103A_6$, $103A_7$ can be controlled by the magnetization fixed layers $103A_2$, $103A_9$ in accordance with the direction of the write current Iw. The magnetization direction of the magnetic domains at the tip portions of the magnetic nanowires $101a_1$-$101a_3$ of the group of magnetic nanowires 101A at this time follows the magnetization direction of the ferromagnetic layers $103A_4$, $103A_5$, $103A_6$, $103A_7$. Thus, the magnetization direction of the magnetic domains at the tip portions of the group of magnetic nanowires 101A can be controlled to record data "0" or "1" by the direction of the write current Iw caused to flow between the electrode $103A_1$ and the electrode $103A_{10}$ of the recording and reproducing element 103A. The direction of the write current Iw is determined by the data read from the group of magnetic nanowires 101B. The data can be recorded to the magnetic nanowires $101a_1$-$101a_3$ of the group of magnetic nanowires 101A simultaneously and collectively in this manner.

Figure 4C:
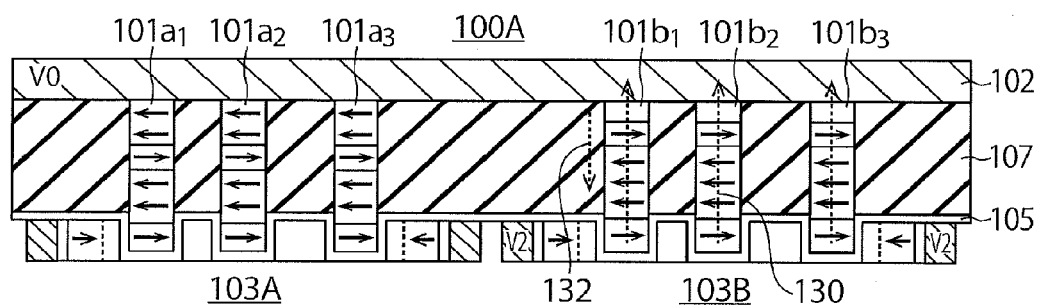
Figure 4D:
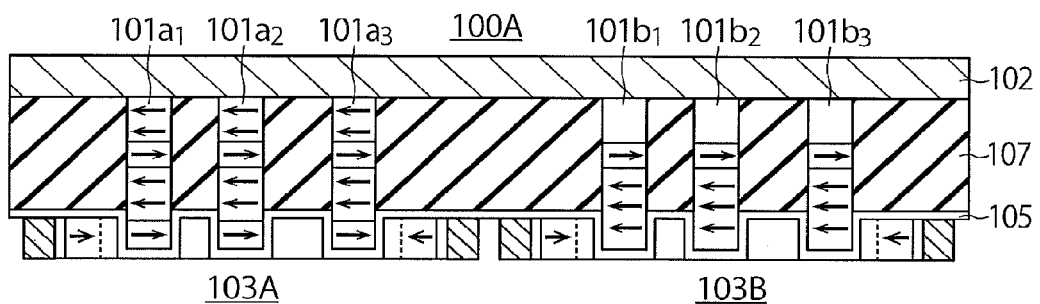

As described above, data of one bit can be moved from the group of magnetic nanowires 101B to the group of magnetic nanowires 101A. Finally, the magnetic domains on the group of magnetic nanowires 101B are shifted by one bit. Specifically, a potential V0 is applied to the non-magnetic electrode 102, and a potential V2 (V0<V2) is applied to the electrode $103B_1$ and the electrode $103B_{10}$ of the recording and reproducing element 103B on the group of magnetic nanowires 101B side, as shown in FIG. 4C. As a result, a current flows in the direction shown by an arrow 130 on each of the magnetic nanowires $101b_1$-$101b_3$ of the group of magnetic nanowires 101B to move the magnetic domain walls on the magnetic nanowires $101b_1$-$101b_3$ due to the influence of spin of electrons. The magnetic domains are therefore shifted along the direction indicated by an arrow 132, which is opposite to the direction in which the current flows, to the recording and reproducing element 103B side. The shifting is completed in this manner (FIG. 4D). The shifting of magnetic domains by one bit can be performed by controlling the current amount and the time. The shifting of the magnetic domain walls is performed on all the magnetic nanowires of the target group of magnetic nanowires simultaneously and collectively.

The magnetic domains can be shifted by one bit from the group of magnetic nanowires 101B to the group of magnetic nanowires 101A without losing any data in this manner. A shift operation for shifting the magnetic domains by a plurality of bits can be performed by repeating the above operation. Furthermore, the direction of the shift operation can be reversed if the group of magnetic nanowires 101A is read as the group of magnetic nanowires 101B, the group of magnetic nanowires 101B is read as the magnetic nanowire 101A, and the above operation is performed. Using this technique, data on a predetermined position on a magnetic nanowire can be moved to a position corresponding to the recording and reproducing element by a shift operation, and can be reproduced by the read current Ir. Similarly, target data can be written to a predetermined position by the write current Iw.

According to the second embodiment, the same data can be recorded to a plurality of magnetic nanowires constituting a group of magnetic nanowires. This has an advantage in that problems caused by missing of magnetic nanowires such as disconnection, recording errors, reproducing errors, shift operation errors may be avoided. For example, if a group of magnetic nanowires includes five magnetic nanowires, the amount of change in the read current Ir in a read operation becomes five times that in a conventional case where only single magnetic nanowire is used. Accordingly, the signal-to-noise ratio is improved and reading errors are reduced. If a write operation fails on one of the magnetic nanowires for some reasons, a sufficient amount of change in read current Ir can be obtained from the other four magnetic nanowires, for which the write operation is performed successfully. Thus, whether data is "0" or "1" can be determined. If a shift operation fails on one of the magnetic nanowires due to disconnection, a sufficient amount of change in read current Ir can be obtained from the other four magnetic nanowires, for which the shift operation succeeded. Thus, whether data is "0" or "1" can be determined. If more than half of magnetic nanowires in the same group of magnetic nanowires are correctly written, a read operation can be performed accurately.

The number of magnetic nanowires constituting a group of magnetic nanowires is not fixed for all the recording and reproducing elements. Therefore the magnetic nanowires and the recording and reproducing elements are not necessarily in a one-to-one relationship, and the groups of magnetic nanowires are not required to be regularly arranged as long as the pitch of the groups of magnetic nanowires is satisfactorily narrow. Since one terminal of each magnetic nanowire is connected to a common non-magnetic electrode, the positioning accuracy and the arrangement accuracy of the magnetic nanowires are not required in this point, too. Thus, the second embodiment considerably eases the accuracy in positioning and arrangement during the manufacture.

The recording and reproducing element according to the second embodiment has an advantage in that it can form magnetic domains in a magnetic nanowire extending in a direction perpendicular thereto as in the case of the magnetic memory 100A according to the second embodiment. Furthermore, the recording and reproducing element is capable of performing so-called "perpendicular magnetic recording" in which the magnetization of magnetic nanowires is directed to a direction perpendicular to the longitudinal direction of the magnetic nanowires. This can improve the recording density of the magnetic nanowires. In addition, the recording and reproducing element also has an advantage in that a single recording and reproducing element can record data to and reproduce data from a plurality of magnetic nanowires at a time, and that it can also serve as an electrode for causing a current to shift the magnetic domains of the magnetic nanowires.

(Third Embodiment)

A method of manufacturing a magnetic memory according to a third embodiment will be described with reference to FIGS. 5A to 7B. The manufacturing method according to the third embodiment is for manufacturing the magnetic memory according to the first or second embodiment. For example, a magnetic memory for recording around 10-terabit data in a chip having an area of 100 mm$^2$ will be described. The diameter of each magnetic nanowire is approximately 20 nm, the minimum length of the magnetic domain representing one bit is approximately 30 nm. The limit of the pitch of the recording and reproducing elements is considered to be approximately 60 nm at the present stage, taking into account the conventional lithographic methods for forming electrodes and wiring lines by lights or electron beams. Accordingly, the pitch of the magnetic nanowires or the groups of magnetic nanowires connected to the recording and reproducing elements also becomes approximately 60 nm. In order to record data in the nanowires or the groups of magnetic nanowires arranged at intervals of 60 nm at a recording density of 10 terabits/100 mm$^2$, data of approximately 500 bits should be recorded in a single magnetic nanowire or group of magnetic nanowires. Assuming that data of one bit is recorded in a length of approximately 30 nm, the length of a magnetic nanowire is approximately 15 μm with the aspect ratio of about 750. In order to achieve the recording density of 30 nm per bit on a magnetic nanowire, a so-called "perpendicular magnetization film," in which the direction of easy magnetization axis is perpendicular to the direction along which the magnetic nanowire extends, is preferably employed. For this purpose, for example, magnetic nanowires including a base layer of platinum and layers of cobalt and/or nickel or multilayer films of these materials, or magnetic nanowires in which the easy magnetization axis is controlled to be in a perpendicular direction by using alloys of iron and cobalt or iron and platinum.

As described above, a three-dimensional structure, in which a recording and reproducing element is formed on a plane and magnetic nanowires serving as recording carriers are formed so as to be perpendicular to the recording and reproducing element, is effective to reduce the number of lithographic processes required to form the recording and reproducing element as many as possible, and to improve the recording density per unit area. However, it is very difficult to form minute magnetic nanowires with a high aspect ratio perpendicularly. Therefore, a method is considered in which holes with a high aspect ratio are formed, and a magnetic material is deposited into the holes to form nanowires. General methods for forming high-aspect-ratio holes in the art of semiconductor manufacturing use a Bosch process, in which holes are formed by dry etching with sidewalls of the holes being protected by shavings formed in the dry etching process. Even if such methods are used, however, it is difficult to achieve high-aspect-ratio holes by dry etching such as reactive ion etching (RIE) or milling at the present stage.

Accordingly, the manufacturing method according to the third embodiment employs a wet etching process by means of anodizing to form high-aspect-ratio holes. Depending on the size, the dry etching process described above may be employed. Alternatively, in order to obtain a high aspect ratio, low-aspect-ratio holes or nanowires may be repeatedly formed. In this case, conventional lithographic and etching techniques, or self-assembly lithographic techniques using copolymers may be used. Other methods include metal-assisted chemical etching for selectively etching a silicon substrate with a high aspect ratio using a solution containing hydrofluoric acid and hydrogen peroxide with a noble metal catalyst.

A manufacturing method employing anodizing will be described below. A metal substrate, for example an aluminum substrate 302, is prepared (FIG. 5A). If a current flows through an electrolytic solution (sulfuric acid solution, oxalic acid solution, phosphoric acid solution, etc.) with the metal substrate 302 being used as an anode, the anode metal is oxidized to generate metal ions, which are dissolved into the solution. The metal ions are combined with oxygen in water to form metal oxide, which grows on the surface of the anode metal. This means that aluminum oxide (alumina) 304 grows on the aluminum substrate 302, as shown in FIG. 5B. The dissolution and the growth advance simultaneously, which results in the alumina 304 having minute holes 304a grown on the aluminum substrate 302 of the anode. The size of the holes 304a is determined depending on the purity of aluminum of the aluminum substrate 302, the applied voltage, the type of electrolytic solution, and the treatment time. For example, if an aluminum substrate 302 having a purity of 99.995% or more is treated with sulfuric acid at a voltage of a few ten V for a few ten minutes, holes 304a having a diameter of 20 nm, a pitch of 60 nm, and a depth of 15 μm are formed (FIG. 5C). The holes formed by the anodizing are not through-holes regardless of the treatment time and the treatment conditions since the lower portion of the metal substrate serves as a barrier layer 302a as shown in FIG. 5D. Therefore, after the anodizing, a resultant structure includes an alumina portion 304 having the holes 304a on the barrier layer 302a, as shown in FIG. 5D.

The manufacturing method according to the third embodiment requires through-holes since electrodes and elements are disposed on both sides of magnetic nanowires. Accordingly, the aluminum substrate with the alumina portion 304 having a plurality of holes 304a formed by the anodizing is processed to become a membrane by melting the unreacted aluminum substrate portion 302a serving as the barrier layer by means of a strong acid to separate the alumina portion 304 from the unreacted aluminum substrate portion 302a, as shown in FIG. 5E. The separated anodized alumina portion 304 becomes a membrane 310 of alumina having the through holes 304a. Chemical mechanical polishing (CMP) may be performed to smooth the surface of the membrane 310. This smoothing may be performed after the deposition of a magnetic material, which will be described later.

If a magnetic material is deposited within the through holes 304a of the membrane 310 by chemical vapor deposition (CVD), for example, the magnetic nanowires 101 are formed within the through holes 304a, as shown in FIG. 5F. Since the deposition is performed in the high-aspect-ratio holes, CVD or plating is preferable. Such deposition methods as sputtering and vapor deposition can also be used. A perpendicular magnetization film is preferably formed by means of a multilayer film or a magnetic alloy. The deposition may be performed to fill the material into the holes 304a, or put the material only on the inner walls of the holes 304a to form magnetic nanowire tubes. The magnetic nanowires 101 are preferably electrically insulated from each other. With respect to this point, alumina is a preferable insulating material to form the membrane 310. The anodizing may also be performed on a silicon substrate using hydrofluoric acid solution as the electrolytic solution. In this case, holes are formed in silicon oxide. The hole diameter in this case is larger than that of alumina, a few hundred nm or more. Since the silicon oxide is not an insulating material, a separate insulating layer is required. However, the use of silicon substrate has an advantage in that holes can be directly formed through a silicon wafer substrate, on which semiconductor elements are formed. As described above, the alumina substrate 312 having a plurality of magnetic nanowires 101 therethrough can be formed by depositing a magnetic material into through-holes of the membrane 310 of alumina (FIG. 5F).

Wiring lines including electrodes for shift operation and recording and reproducing elements should be disposed at both ends of respective magnetic nanowires 101. The wiring lines and the recording and reproducing elements are formed on silicon wafers through a semiconductor manufacturing process. Therefore, the memory has a three-layer structure in which the alumina substrate 312 having the magnetic nanowires 101 is bonded with wafer substrates having wiring lines and elements at the top surface and the bottom surface of the alumina substrate. The three layers should be correctly positioned when being bonded together.

Figure 6:
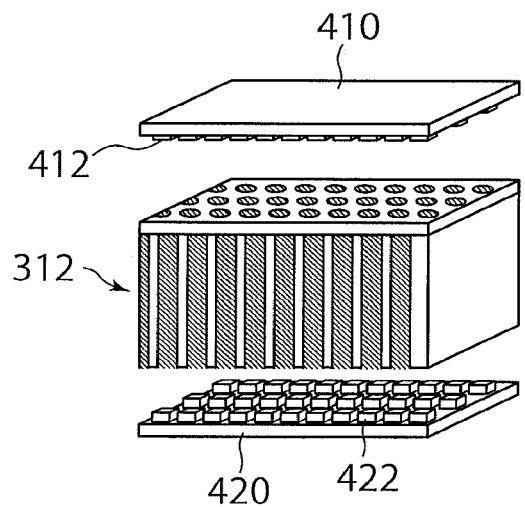
FIG. 6 is an explanatory diagram illustrating a comparative example to explain the method of manufacturing a magnetic memory.

For example, assuming that the pitch of the recording and reproducing elements 422 of a comparative example shown in FIG. 6 is 60 nm, the substrate 410 on which electrodes 412 are formed and the substrate 420 on which the recording and reproducing elements 422 are formed at the top and the bottom of the alumina substrate 312 should be positioned in bonding with the position error of 60 nm or less. Since the alumina substrate 312 with a thickness of 15 μm is present between the substrate 410 and the substrate 420, the substrates 410, 420 at a distance of 15 μm should be positioned and bonded at the positioning accuracy of 60 nm or less. This is difficult with the present positioning control technique.

In order to deal with this problem, one terminals of the magnetic nanowires are connected to a common non-magnetic electrode 314 in the method of manufacturing a magnetic memory according to the third embodiment (FIG. 5G). Specifically, a non-magnetic, conductive material such as gold, silver, copper, or aluminum is deposited on one surface of the alumina substrate 312, through which the magnetic nanowires are formed, by sputtering, deposition, CVD, plating, or spin coating. Since all or an indefinite number of magnetic nanowires 101 are connected to this electrode, positioning is unnecessary for the one end of the alumina substrate 312 having the magnetic nanowires. This greatly eases the positioning accuracy in bonding substrates in the manufacturing process.

In the method of manufacturing a magnetic memory according to the third embodiment, a substrate 320, on which recording and reproducing elements 322 each corresponding to one of the magnetic nanowires 101 are formed, is prepared as shown in FIG. 5H, and the substrate 320 and the alumina substrate 312, on the top of which the non-magnetic electrode 314 is bonded, are bonded together so that each recording and reproducing element 322 is connected to the corresponding one of the magnetic nanowires 101. This requires alignment of each magnetic nanowire 101 and the corresponding recording and reproducing element 322. The magnetic memory 100 according to the first embodiment shown in FIG. 1 is manufactured in this manner.

Another substrate 320A may be prepared, on which a plurality of recording and reproducing elements 322A each corresponding to a plurality of magnetic nanowires 101 are formed, as shown in FIG. 5I, and the substrate 320A may be bonded to the alumina substrate 312, on the top of which the non-magnetic electrode 314 is formed, so that each recording and reproducing element 322A is connected to corresponding magnetic nanowires 101. The magnetic memory 100A according to the second embodiment shown in FIG. 3 is manufactured in this manner. In this case, the number of magnetic nanowires 101 connected to one recording and reproducing element 320A may be varied. This allows the position accuracy in bonding not to be strict if the pitch of the magnetic nanowires is satisfactorily smaller than the pitch of the recording and reproducing elements. If the pitch of the magnetic nanowires is narrow, more than one magnetic nanowires are always connected to each recording and reproducing element. This allows each group of magnetic nanowires to be connected to the common non-magnetic electrode 314. Therefore, regardless of which magnetic nanowire is connected to which recording and reproducing element, the magnetic memory according to the second embodiment operates.

As described above, the bonding position accuracy, which is required in the manufacturing process, of the substrate on which the recording and reproducing elements are formed, is considerably eased for the manufacturing method according to the third embodiment.

The magnetic memory 100A according to the second embodiment, however, reduces the recording capacity per the number of magnetic nanowires since the same data is stored in a plurality of magnetic nanowires. In order to secure the recording capacity, the pitch of the magnetic nanowires may be narrowed to increase the total number of magnetic nanowires, or the magnetic nanowires may be elongated to increase the recording density per unit area. If anodizing is employed to form the magnetic nanowires, the magnetic nanowires can be elongated easily. Accordingly, this does not make a problem. For example, magnetic nanowires having a length of 200 μm or more can be formed by controlling the anodizing time.

When anodizing is employed, the arrangement of magnetic nanowires cannot be completely controlled. A certain degree of positioning control is possible by marking positions which serve as starting points of oxidizing reaction on the surface of the aluminum substrate where magnetic nanowires are to be formed. This method, however, is not perfect, and the oxidizing reaction does not always proceed perpendicularly and linearly, resulting in the branching and the disconnection of holes. If such defects occur, it is not possible to bond the magnetic nanowires and the recording and reproducing elements in one-to-one relationship regardless of the positioning accuracy in the bonding technique. For example, in the comparative example shown in FIG. 6, if the magnetic nanowires in the alumina substrate 312 have branches and disconnections, the substrate 410 and the substrate 420 cannot be bonded to the both sides of the alumina substrate 312 with each recording and reproducing element 422 being bonded to one of the magnetic nanowire in one-to-one relationship.

Figure 7A:
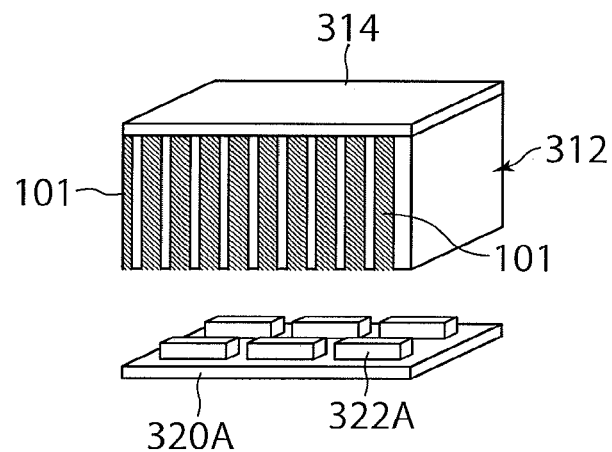
FIG. 7A and FIG. 7B are explanatory diagrams illustrating the method of manufacturing the magnetic memory according to the second embodiment.
Figure 7B:
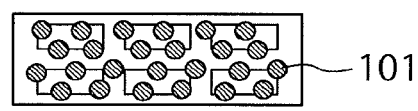

However, if a magnetic memory has a structure in which an assembly including the alumina substrate 312 with a plurality of magnetic nanowires 101 and the common non-magnetic electrode 314 formed on the top surface of the alumina substrate 312 is bonded to the substrate 320A on which a plurality of recording and reproducing elements 322A are formed, and more than one magnetic nanowire 101 is connected to one of the recording and reproducing elements 322A as shown in FIG. 7A, the magnetic nanowires are not necessarily bonded to the recording and reproducing element in a precise one-to-one relationship. Since a plurality of magnetic nanowires are connected to one recording and reproducing element, the magnetic memory may operate if all the magnetic nanowires are branched or disconnected except for at least one magnetic nanowire. Furthermore, since the other terminals of the magnetic nanowires are connected to the common non-magnetic electrode 314 and the alignment of elements at both the sides of each magnetic nanowire can be eliminated, the magnetic nanowires may not be completely perpendicular to the substrates. A magnetic nanowire 101 that is not connected to any of the recording and reproducing elements may be present as shown in FIG. 7B. FIG. 7B shows the arrangement of the magnetic nanowires 101 viewed from the lower surface of the substrate 320A through the substrate 320A. However, if there is a magnetic nanowire that is connected to two recording and reproducing elements, an error occurs in the recording, reproducing, and shift operations. Therefore, it is desirable that the interval between recording and reproducing elements be greater than the diameter of the magnetic nanowires.

As described above, according to the method of manufacturing a magnetic memory according to the third embodiment, the positioning accuracy in bonding substrates in the manufacturing process can be considerably eased, and manufacturing methods with problems of alignment accuracy and/or defects such as the anodizing can be employed.

(Fourth Embodiment)

A method of manufacturing a magnetic memory according to a fourth embodiment will be described with reference to FIGS. 8A to 8F.

Figure 8A:
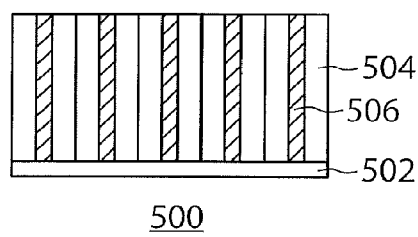
FIGS. 8A to 8F are explanatory diagrams illustrating a method of manufacturing a magnetic memory according to a fourth embodiment.

First, a substrate 500 including a common non-magnetic electrode 502, and a plurality of magnetic nanowires 506 embedded in an insulating material 504 is prepared as shown in FIG. 8A. The substrate 500 is formed in the following manner. A magnetic material is deposited on the insulating material 504 having nano holes, the insulating material 504 being, for example, alumina made by anodizing aluminum.

As a result, magnetic nanowires 506 are formed in the nano holes of alumina. The non-magnetic electrode 502 is formed by, for example, a sputtering method, CVD, or plating method on one surface of the alumina in which the magnetic nanowires 506 are formed. The non-magnetic electrode 502 is formed of, for example, gold, silver, copper, or aluminum.

In the manufacturing method according to the third embodiment, an element substrate including a silicon wafer and recording and reproducing elements formed thereon is prepared, which is bonded to a substrate 500 including magnetic nanowires. In the fourth embodiment, recording and reproducing elements are formed on the magnetic nanowire substrate 500.

Figure 8B:
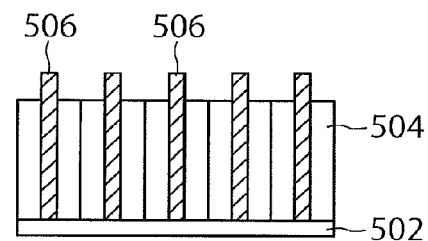

First, the tips of the magnetic nanowires 506 are exposed by etching the surface of the insulating material 504 on the opposite side to the non-magnetic electrode 502, as shown in FIG. 8B. The etching method preferably processes the insulating material (in this case, alumina) selectively. Wet etching using an acid can be used here.

Figure 8C:
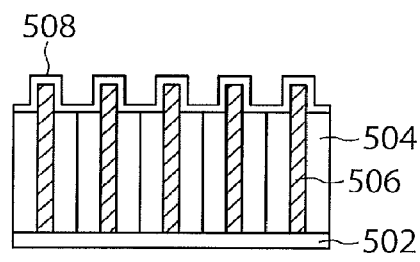

Next, the non-magnetic layer 508 covering the exposed tip portions of the magnetic nanowires 506 is formed by, for example, a sputtering method, CVD, or plating method, as shown in FIG. 8C. The non-magnetic layer 508 is formed of, for example, magnesium oxide or aluminum oxide.

Figure 8D:
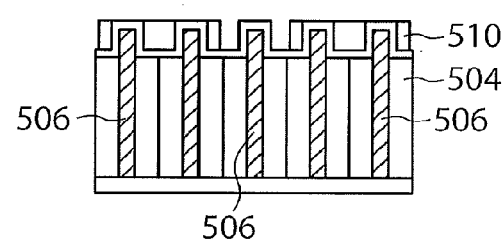

Thereafter, the ferromagnetic layer 510 is formed on the non-magnetic layer 508 by a sputtering method, CVD, deposition, or plating method, as shown in FIG. 8D. The ferromagnetic layer 510 is formed of a metal selected from the group consisting of iron, cobalt, and nickel, or an oxide or alloy containing at least one of the above metals. The ferromagnetic layer 510 is patterned by lithographic means, for example an etching method using an exposed resist mask or a lift-off method. One pattern on the ferromagnetic layer corresponds to one recording and reproducing element. In the magnetic memory according to the first embodiment, for example, one pattern of the ferromagnetic layer 510 is aligned to one of the magnetic nanowires. In the magnetic memory according to the second embodiment, one pattern of the ferromagnetic layer 510 is to be in contact with a plurality of magnetic nanowires.

Figure 8E:
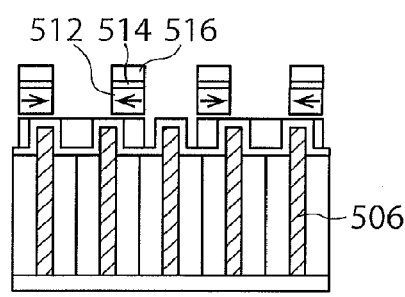
Figure 8F:
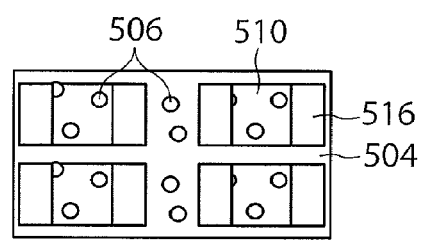

Next, the magnetization fixed layers 512, in which the magnetization direction is fixed, the antiferromagnetic layers 514 formed of iridium manganese or iron manganese, and the electrode 516 formed of gold, silver, copper, or aluminum for example is sequentially formed on the ferromagnetic layer 510 as shown in FIGS. 8E and 8F to complete the magnetic memory. These layers and electrode are directly formed on the existing patterns by deposition and lithography. Therefore, the positioning accuracy is improved as compared to the third embodiment where the substrates are bonded together. Since the non-magnetic electrode 502 is disposed on the opposite side of the substrate 500 including the magnetic nanowires 506, it is not necessary to consider the positioning on this surface. If the ferromagnetic layer is in contact with a plurality of and an unknown number of magnetic nanowires as in the second embodiment, the magnetic nanowires are not necessarily arranged regularly. Furthermore, the positioning accuracy in patterning the ferromagnetic layer may be low. Thus, the recording and reproducing elements can be formed more easily. FIG. 8F is a top view of the magnetic memory shown in FIG. 8E, viewed from the top surface.

The magnetic memories according to the first and the second embodiments can be formed according to the manufacturing method according to the fourth embodiment.

(Fifth Embodiment)

Figure 9A:
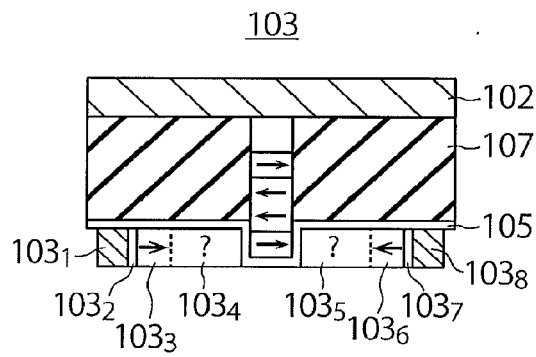
FIGS. 9A to 9E are explanatory diagrams illustrating a signal reproducing method according to a fifth embodiment.

A method of reproducing data in a magnetic memory according to a fifth embodiment will be described below. The reproducing method according to the fifth embodiment is for the magnetic memory according to the second embodiment shown in FIG. 3. Specifically, the reproducing method according to the fifth embodiment uses a recording and reproducing element 103 including ferromagnetic layers $103_4$, $103_5$ that are in contact via the non-magnetic layer 105 with one terminal (lower end) of a group of magnetic nanowires (a single magnetic nanowire in the drawing) 101, a pair of magnetization fixed layers $103_3$, $103_6$ that are in contact with the ferromagnetic layers $103_4$, $103_5$, respectively, antiferromagnetic layers $103_2$, $103_7$ for fixing the magnetization of the magnetization fixed layer $103_3$, $103_6$ in one direction, and a pair of electrodes $103_1$, $103_8$, as shown in FIG. 9A. The reproducing method according to the fifth embodiment has an advantage that a single recording and reproducing element 103 can record data to and reproduce data from a plurality of magnetic nanowires 101 simultaneously.

If the magnetization direction of the magnetic domain at the lower end of the magnetic nanowire 101 is to be read, a current is caused to flow between the electrodes $103_1$, $103_8$ of the recording and reproducing element 103, and the magnetization direction is determined based on the current value, i.e., the resistance value between the electrodes $103_1$, $103_8$. If the magnetization direction at the lower end of the magnetic nanowire 101 is in parallel with (in the same direction as) the magnetization direction of the ferromagnetic layers $103_4$, $103_5$, the resistance between the electrodes $103_1$, $103_8$ is low, and if it is antiparallel (in the opposite direction), the resistance between the electrodes $103_1$, $103_8$ is high. Therefore, it is desirable that the magnetization direction of the ferromagnetic layer $103_4$, $103_5$ be known in reading data. FIG. 9A shows a case where the magnetization direction of the ferromagnetic layers $103_4$, $103_5$ is unknown.

As described above, the magnetization direction of the ferromagnetic layers $103_4$, $103_5$ can be made the same by applying a write voltage between the electrodes $103_1$, $103_8$ of the recording and reproducing element 103 when data is recorded to the magnetic nanowire 101. This means that the magnetization direction is determined by whether the previously recorded data is "0" or "1." Therefore, the magnetization direction of the magnetic domain at the lower end of the magnetic nanowire 101 can be determined by the magnitude of the resistance between the electrodes of the recording and reproducing element 103 if the previously recorded data is maintained.

Figure 9B:
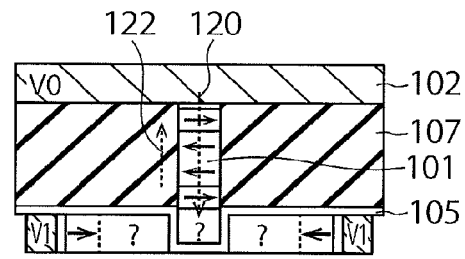
Figure 9C:
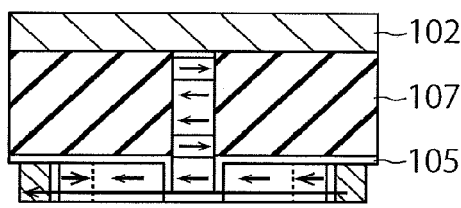
Figure 9D:
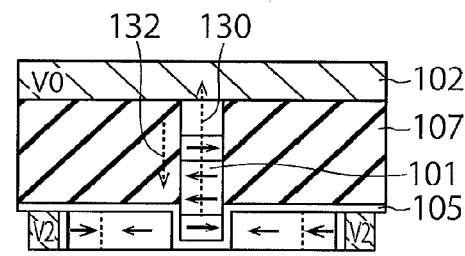
Figure 9E:
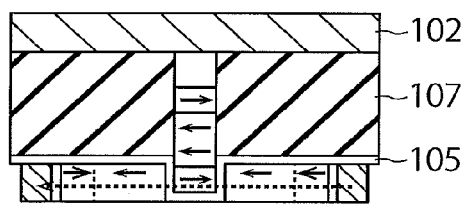

Another method of obtaining the magnetization direction of the ferromagnetic layers $103_4$, $103_5$ in advance is to fix the magnetization direction of the ferromagnetic layer $103_4$, $103_5$ in a predetermined direction before reading data. The magnetization direction of the ferromagnetic layers $103_4$, $103_5$ can be made to a desired direction by applying a write voltage between the electrodes $103_1$, $103_8$ of the recording and reproducing element 103. This, however, also writes data to the magnetic domain at the tip of the magnetic nanowire 101. In order to avoid this, a shift current 120 is caused to flow through the magnetic nanowire 101 before data is read to shift the magnetic domains on the magnetic nanowire 101 to the direction opposite to the recording and reproducing element 103 as indicated by an arrow 122 in FIG. 9B. Thereafter, a high write voltage is applied between the electrodes of the recording and reproducing element 103 to direct the magnetizations of the ferromagnetic layer $103_4$, $103_5$ to the same direction, as shown in FIG. 9C. Subsequently, a shift current 130 is caused to flow through the magnetic nanowire 101 to shift the magnetic domain at the lower end of the magnetic nanowire 101 to the opposite direction to the aforementioned direction, as indicated by an arrow 132, to return the magnetic domain to the original position, as shown in FIG. 9D. Then, the resistance value between the electrodes $103_1$, $103_8$ of the recording and reproducing element 103 is checked. The magnetization direction of the magnetic domain at the lower end of the magnetic nanowire 101 can be read in this manner to reproduce the data (FIG. 9E). According to this method, the magnetization directions of the ferromagnetic layers $103_4$, $103_5$ are made in a desired direction. Accordingly, the bit can be read without any problem. Furthermore, the data unintentionally written to the lower end of the magnetic nanowire 101 when the magnetization directions of the ferromagnetic layers $103_4$, $103_5$ are made in the same direction does not cause any problem since the data is erased by the last shift operation (shown in FIG. 9D).

(Sixth Embodiment)

Figure 10A:
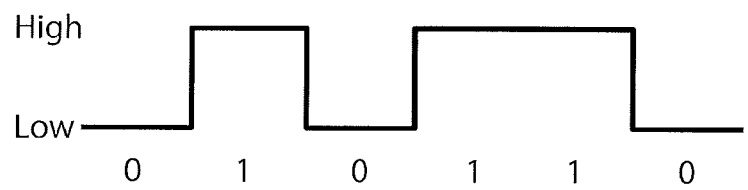
FIGS. 10A to 10C are waveform diagrams for explaining the signal reproducing method according to a sixth embodiment.

A method of reproducing data from a magnetic memory according to a sixth embodiment will be described below. The reproducing method according to the sixth embodiment is for the magnetic memory according to the second embodiment shown in FIG. 3. Like the reproducing method according to the fifth embodiment, the reproducing method according to the sixth embodiment has an advantage that a single recording and reproducing element 103 can read, i.e. reproduce, data from magnetic domains of a plurality of magnetic nanowires 101 simultaneously by determining the magnetization direction of the magnetic domains. The magnetization direction is read based on the magnitude of the resistance between the electrodes of the recording and reproducing element. As in the fifth embodiment, the resistance value is determined by the magnetization direction of the group of magnetic nanowires relative to the magnetization direction of the ferromagnetic layers. Therefore, if the number of magnetic nanowires connected to each recording and reproducing element is the same, and no error occurs in a reading operation, the H level and the L level of a reproduced signal can be determined as shown in FIG. 10A. This makes it possible to determine "0" or "1" in a 1-bit unit. The number of magnetic nanowires, however, generally differs for each recording and reproducing element. Accordingly, the absolute value of the resistance value also differs for each recording and reproducing element. Therefore, determining the magnetization direction of a magnetic nanowire from a resistance value may require a scheme.

An example of the scheme is to measure the resistance value of each recording and reproducing element by recording known data to and reproducing the known data from each group of magnetic nanowires, and storing the measured resistance value in a separate registry etc. In reading the magnetization direction of a magnetic domain by a recording and reproducing element, the magnetization direction can be determined by comparing the resistance value between the electrodes of the recording and reproducing element to the resistance value stored as known data in the registry.

Figure 10B:
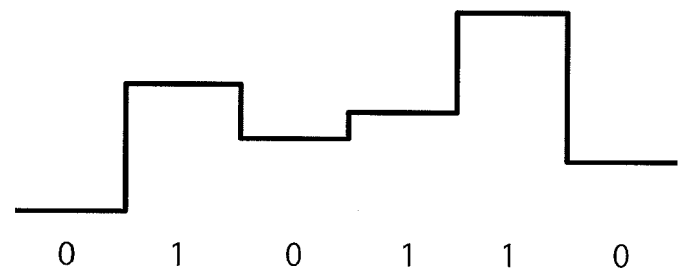

Another example is to read a plurality of bits (magnetic domains), and determine data (magnetization direction) from the signal waveforms thereof. Since the number of magnetic nanowires connected to each recording and reproducing element varies, the magnetization direction, i.e., whether the read signal is at the "H" level or "L" level, cannot be determined from the signal waveform representing 1 bit, as can be understood from FIG. 10B. However, the magnetization direction may be determined by comparing the magnitudes of a plurality of bits, or classifying the values of signals containing a plurality of bits into two levels with the mean value thereof being set as a threshold value.

Figure 10C:
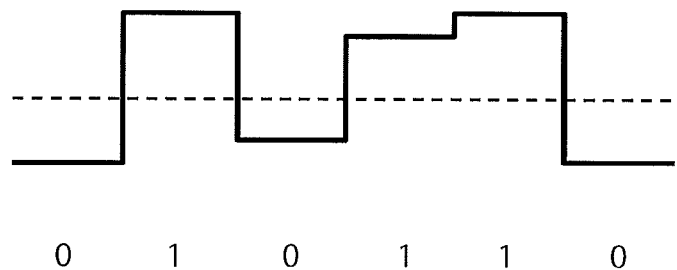

A further desirable way of this example is to read a plurality of bits that are sequential on the magnetic nanowires of the same group at a time. The sequential bits on the magnetic nanowires in the same group are ensured to have an identical values since they are read by the same recording and reproducing element, and even if the absolute resistance values are unknown, the number of magnetic nanowires is the same. Specifically, as shown in FIG. 10C, even if the absolute values of the "H" level and the "L" level of the read signals are unknown, the waveform of the reproduced signals obtained from between the electrodes of the same recording and reproducing element basically have two levels (depending on whether the magnetization direction of the magnetic domain is identical or opposite to the magnetization direction of the ferromagnetic layers). Accordingly, if these two levels appear in the signal waveform of the read bits, the magnetization direction can be determined. If the two levels are determined by setting a threshold value at a mean value in the signal waveform of the read bits, or the intermediate value between the peaks of the signal waveform, data can be reproduced correctly even if errors may occur in some of the magnetic nanowires in the group of magnetic nanowires.

According to the aforementioned method using the signal waveform obtained from a plurality of bits, a registry storing a threshold value for each recording and reproducing element is not needed, but only a registry for a few bits is needed. This lightens the load of circuit. Furthermore, the process for measuring the resistance values of all the recording and reproducing elements and storing the measured values in a registry before shipping the products can be eliminated.

(Seventh Embodiment)

Figure 11:
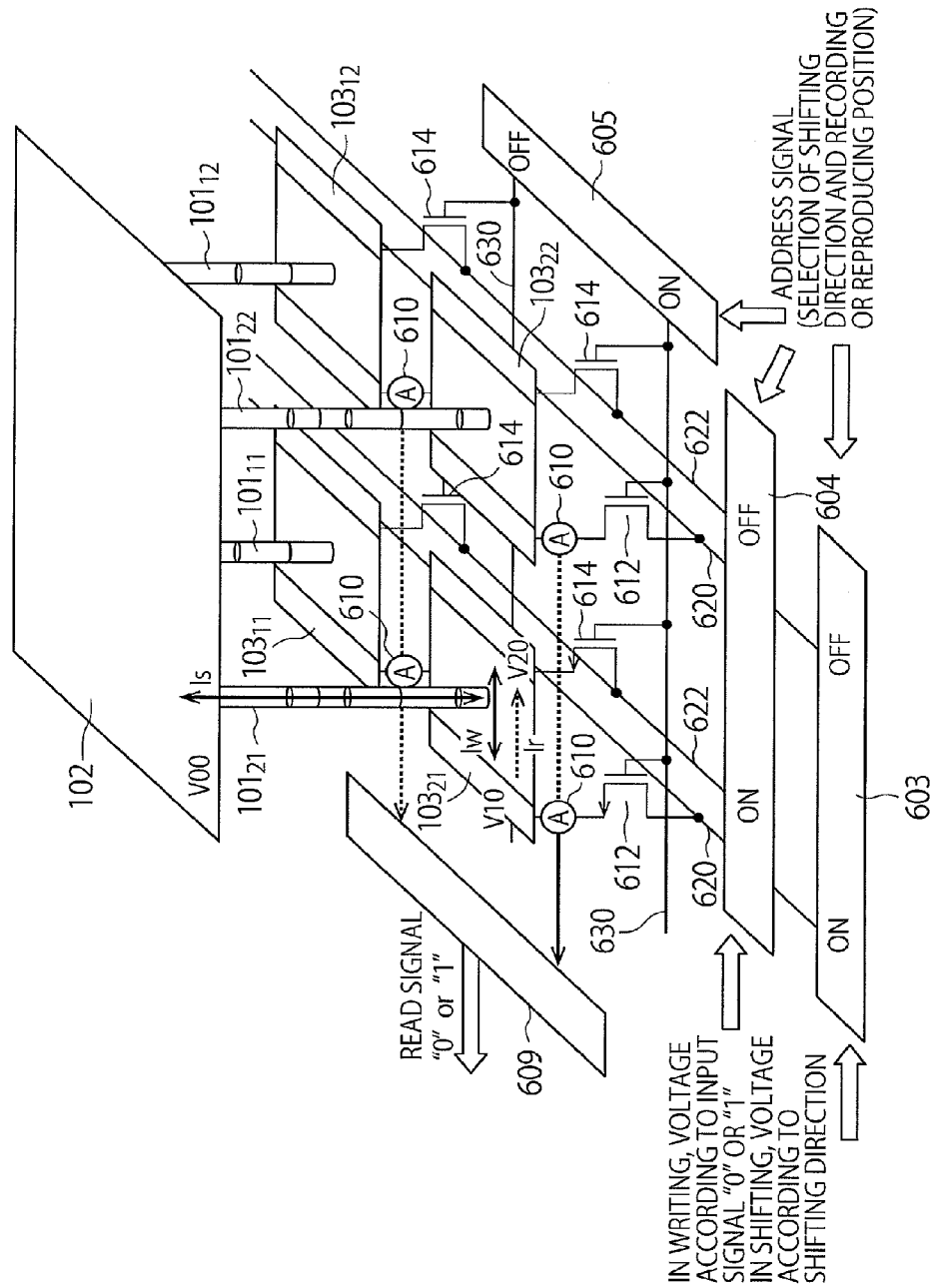
FIG. 11 is a diagram showing a magnetic memory according to a seventh embodiment.

A shift register type magnetic memory according to a seventh embodiment will be described with reference to FIG. 11. The magnetic memory according to the seventh embodiment includes a plurality of magnetic nanowires $101_{11}$-$101_{22}$, a common non-magnetic electrode 102, and a plurality of recording and reproducing elements $103_{11}$-$103_{22}$ arranged in a matrix form. A magnetic nanowire $101_{ij}$ corresponds to a recording and reproducing element $103_{ij}$ (i, j=1, 2). One terminal of the magnetic nanowire $101_{ij}$ (i, j=1, 2) is connected to the common non-magnetic electrode 102, and the other terminal is connected to the corresponding recording and reproducing element $103_{ij}$.

The magnetic memory according to the seventh embodiment further includes selectors 603, 604, 605 and a binarizing circuit 609. The selectors 603, 604, 605 and the binarizing circuit 609 are formed on a semiconductor substrate (not shown), on which the recording and reproducing elements $103_{11}$-$103_{22}$ are formed. Two wiring lines 620, 622 are arranged for each column of recording and reproducing elements $103_{11}$-$103_{22}$ in the matrix form. One of the two electrodes of each recording and reproducing element is connected to the corresponding wiring line 620 via a current sensor 610 and a transistor 612, and the other is connected to the corresponding wiring line 622 via a transistor 614. The wiring line 620 is connected to the selector 603, and the wiring line 622 is connected to the selector 604.

A wiring line 630 is further connected to each row of the recording and reproducing elements $103_{11}$-$103_{22}$ arranged in the matrix form. The wiring line 630 is connected to gates of the transistor 612 and the transistor 614 connected to the corresponding recording and reproducing element, and also connected to the selectors 605.

The detected value of the current sensor 610 connected to each recording and reproducing element is sent to the binarizing circuit 609, and outputted as a read signal from the binarizing circuit 609.

Next, the operation of the magnetic memory according to the seventh embodiment will be described below.

It is assumed that a target address is at a position on the magnetic nanowire $101_{21}$ connected to the recording and reproducing element $103_{21}$. In this case, the electrodes of the recording and reproducing element $103_{21}$ are selected by the selector 603, the selector 604, and the selector 605, as shown in FIG. 11. The selector 603 and the selector 604 serve as a first voltage source and a second voltage source, respectively. The selector 603 applies a voltage V10 to one of the electrodes of the selected recording and reproducing element $103_{21}$, and the selector 604 applies a voltage V20 to the other. A voltage V00 is applied to the common non-magnetic electrode 102.

If V00<V10=V20, a shift current Is flows through the magnetic nanowire $103_{21}$ toward the non-magnetic electrode 102 side, and if V00>V10=V20, the shift current Is flows in the opposite direction toward the recording and reproducing element $103_{21}$ side. As a result, the magnetic domains can be shifted to a desired direction.

If the voltage V20 is higher than the voltage V10 and the difference therebetween is sufficiently great, a high write current (recording current) Iw flows between the electrodes of the selected recording and reproducing element $103_{21}$. As a result, the magnetization of the magnetic domain at the lower end of the magnetic nanowire $103_{21}$ is directed according to the direction of the write current Iw. On the contrary, if the voltage V10 is higher than the voltage V20 and the difference therebetween is sufficiently great, the magnetization of the magnetic domain at the lower end of the magnetic nanowire $103_{21}$ is directed to the opposite direction.

If V10<V20 or V10>V20 and the difference therebetween is not so great, a weak reproduction current Ir flows between the electrodes of the recording and reproducing element $103_{21}$. The magnitude of the reproduction current Ir varies depending on the magnetization direction of the magnetic domain at the lower end of the magnetic nanowire $103_{21}$. Accordingly, the magnetization direction of the magnetic domain, i.e. the recorded data, can be read by measuring the reproduction current Ir by means of the current sensor 610 connected to one of the electrodes of the recording and reproducing element $103_{21}$.

In an actual case, the binarizing circuit 609 set two levels to the reproduced current waveform and reads signals as having values "0" or "1". Data is recorded by applying voltages V10, V20 satisfying the aforementioned formula to the electrodes of the recording and reproducing element $103_{21}$ depending on the signals representing "0" or "1."

Thus, the shift operation, the recording operation, and the reproducing operation can be performed by selecting the recording and reproducing element and the magnetic nanowire by means of the selectors, and appropriately applying the voltages V10 and V20 to the electrodes of the selected recording and reproducing element in the aforementioned manner. Furthermore, the operation to read data of "0" or "1" by setting two levels to the signals based on the reproduction current can also be performed. Although a single magnetic nanowire is connected to the recording and reproducing element in this embodiment, a plurality of magnetic nanowires can be connected. If a recording and reproducing element is connected to a group of magnetic nanowires, and the shift operation is performed therein by conveying the data as in the first embodiment and the second embodiment, the magnetic memory can function as a shift register type magnetic memory.

One or a few recording and reproducing elements and groups of magnetic nanowires serving as buffer elements may be provided for a plurality of recording and reproducing elements and a plurality of groups of magnetic nanowires.

When data on a group of magnetic nanowires is reproduced, this group of magnetic nanowires is linked with a buffer group of magnetic nanowires, and a shift operation to convey data as in the first embodiment or second embodiment is performed therebetween. After the data is reproduced, the data on the buffer group of magnetic nanowires is returned to the original group of magnetic nanowires by the shift operation to reset the buffer magnetic nanowire. If data on another group of magnetic nanowires is to be reproduced, this group of magnetic nanowires is newly linked with the reset buffer group of magnetic nanowires to read the data. The ratio of the buffer groups of magnetic nanowires to all the groups of magnetic nanowires can be reduced (to only one, in some cases) in this manner. Accordingly, the recording capacity can be used more effectively as compared to the previously described shift register structure where two groups of magnetic nanowires are linked with each other (in this case, a half of all the groups of magnetic nanowires is used as buffers, which reduces substantial recording capacity).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
   a plurality of groups of magnetic nanowires extending in a direction, a group of the magnetic nanowires including a magnetic nanowire, the magnetic nanowire having a first terminal and a second terminal, a magnetic wall in the magnetic nanowire being shiftable between the first terminal and the second terminal;
   a plurality of recording and reproducing elements corresponding to the groups of magnetic nanowires, a recording and reproducing element writing data to and reading data from the magnetic nanowire of a corresponding group of magnetic nanowires, and connecting to the first terminals of the magnetic nanowires; and
   an electrode to which the second terminals of the magnetic nanowires of the groups of magnetic nanowires are connected.

2. The memory according to claim 1, wherein groups of magnetic nanowires are formed of a single magnetic nanowire respectively.

3. The memory according to claim 1, wherein groups of magnetic nanowires include at least two magnetic nanowires respectively.

4. The memory according to claim 1, wherein the magnetic nanowire includes a plurality of magnetic domains that carry data, and a half or more of the magnetic nanowires in the same group of magnetic nanowires contain identical data.

5. The memory according to claim 1, wherein the recording and reproducing elements are formed on a first plane, the electrode is formed on a second plane on the opposite side of the magnetic nanowires to the first plane, and the groups of magnetic nanowires are present between the first plane and the second plane.

6. The memory according to claim 1, wherein each recording and reproducing element is connected to the first terminals of the magnetic nanowires of the corresponding group of magnetic nanowires via a non-magnetic layer, and includes a first ferromagnetic layer and a second ferromagnetic layer, a first magnetization fixed layer and a second magnetization fixed layer connected to the first ferromagnetic layer and the second ferromagnetic layer, respectively, a first antiferromagnetic layer and a second antiferromagnetic layer connected to the first magnetization fixed layer and the second magnetization fixed layer, and fix magnetizations of the first magnetization fixed layer and the second magnetization fixed layer, respectively, and a first electrode and a second electrode connected to the first antiferromagnetic layer and the second antiferromagnetic layer, respectively.

7. A method of recording data to and reproducing data from the magnetic memory according to claim 6, comprising:
    passing a first current between the first electrode and the second electrode of each recording and reproducing element, and reading a magnetization direction of a magnetic domain recorded in each magnetic nanowire based on a magnitude of the first current; and
    passing a second current that is higher than the first current between the first electrode and the second electrode to change the magnetization direction of the magnetic domain of each magnetic nanowire, thereby writing data thereto.

8. The method according to claim 7, further comprising:
    passing the second current between the first electrode and the second electrode to direct magnetizations of the first ferromagnetic layer and the second ferromagnetic layer to an identical direction;
    performing a shift operation so that the magnetic domain in which data to be read is stored is moved to a position of the recording and reproducing element; and
    reading the data stored the magnetic domain by passing a current between the first electrode and the second electrode.

9. The method according to claim 7, further comprising:
    in reproducing the data stored in a single group of magnetic nanowires, reading a plurality of data items from magnetic nanowires of the group of magnetic nanowires; and
    consolidating the data items to a binarized single data item based on contents of the data items.

10. A method of operating the magnetic memory according to claim 1, comprising:
    writing an identical data item to all of magnetic nanowires of a group of magnetic nanowires connected to one of the recording and reproducing elements simultaneously, and performing a shift operation on the magnetic nanowires to an identical degree.

11. A method of operating the magnetic memory according to claim 1 in which the recording and reproducing elements include a first recording and reproducing element and a second recording and reproducing element, the groups of magnetic nanowires include a first group of magnetic nanowires connected to the first recording and reproducing element and a second group of magnetic nanowires connected to the second recording and reproducing element,
    the method comprising:
    shifting magnetic domains of the first group of magnetic nanowires toward the electrode by one bit;
    reading data of magnetic domains at end portions of the second group of magnetic nanowires by the second recording and reproducing element;
    recording the data to magnetic domains at end portions of the first group of magnetic nanowires by the first recording and reproducing element; and
    shifting magnetic domains of the second group of magnetic nanowires toward the second recording and reproducing element by one bit.

* * * * *